United States Patent
Yamagami et al.

(10) Patent No.: US 8,704,223 B2
(45) Date of Patent: Apr. 22, 2014

(54) SEMICONDUCTOR DEVICE

(76) Inventors: Minoru Yamagami, Tokyo (JP); Hisayuki Nagamine, Tokyo (JP)

( * ) Notice: Subject to any disclaimer, the term of this patent is extended or adjusted under 35 U.S.C. 154(b) by 1263 days.

(21) Appl. No.: 12/007,220

(22) Filed: Jan. 8, 2008

(65) Prior Publication Data

US 2008/0169467 A1  Jul. 17, 2008

(30) Foreign Application Priority Data

Jan. 12, 2007  (JP) ................... 2007-004349

(51) Int. Cl.
*H01L 23/58* (2006.01)

(52) U.S. Cl.
USPC .......... 257/48; 257/789; 257/620; 257/203; 257/207

(58) Field of Classification Search
USPC ........... 257/48, 170, 354, 401, 409; 324/765, 324/158.1, 769
See application file for complete search history.

(56) References Cited

U.S. PATENT DOCUMENTS

| | | | | |
|---|---|---|---|---|
| 4,961,053 A | * | 10/1990 | Krug | 324/537 |
| 4,967,259 A | * | 10/1990 | Takagi | 257/620 |
| 5,561,373 A | * | 10/1996 | Itoh | 324/158.1 |
| 5,598,010 A | * | 1/1997 | Uematsu | 257/48 |
| 6,346,820 B1 | * | 2/2002 | Yamagami | 324/763 |
| 6,489,799 B1 | * | 12/2002 | Murakami | 324/765 |
| 6,603,316 B2 | * | 8/2003 | Oishi | 324/551 |
| 6,605,861 B2 | | 8/2003 | Toyoda | |
| 7,145,356 B2 | * | 12/2006 | Sang Gi | 324/769 |
| 7,242,080 B2 | | 7/2007 | Matsuno | |
| 7,399,990 B2 | * | 7/2008 | Maruyama | 257/48 |

FOREIGN PATENT DOCUMENTS

| | | |
|---|---|---|
| JP | 5-047892 | 2/1993 |
| JP | 2000-349130 A | 12/2000 |
| JP | 2002-093868 A | 3/2002 |
| JP | 2002-217196 A | 8/2002 |
| JP | 2003-332398 A | 11/2003 |
| JP | 2004-047535 A | 2/2004 |
| JP | 2005-116606 A | 4/2005 |
| JP | 2005-150514 A | 6/2005 |
| JP | 2006-041236 A | 2/2006 |

* cited by examiner

*Primary Examiner* — Steven Loke
*Assistant Examiner* — David Goodwin
(74) *Attorney, Agent, or Firm* — Foley & Lardner LLP

(57) ABSTRACT

A transistor of a characteristic checking element has a gate electrode connected to a measurement pad disposed in a dicing line and to an internal measurement pad disposed inside a semiconductor device. In a P/W process, a gate insulating film of the transistor is broken by an electric voltage applied via the internal measurement pad. Since the gate insulating film of the transistor is broken, a new current path is formed. Thus, measurement of accurate characteristics of the characteristic checking element is inhibited.

14 Claims, 9 Drawing Sheets

US 8,704,223 B2

SEMICONDUCTOR DEVICE

This application is based upon and claims the benefit of priority from prior Japanese patent application JP 2007-004349, filed on Jan. 12, 2007, the disclosure of which is incorporated herein by reference in its entirety.

BACKGROUND OF THE INVENTION

This invention relates to a semiconductor device and, in particular, to a semiconductor device provided with a characteristic checking element for checking electric characteristics.

A semiconductor device is produced through a number of manufacturing processes and shipped to a customer. As a front-end process (diffusion process) of the semiconductor device, a deposition process, a photolithography process, and an impurity diffusion process are repeatedly executed on a semiconductor substrate (sub). Through such a number of processes, a wafer with a plurality of semiconductor devices formed thereon is completed. The wafer thus completed is subjected to a pellet/wafer test process (hereinbelow, will be called a P/W process) in order to verify functions and operations of the semiconductor device formed thereon. Thus, the wafer is judged to be good or defective. Further, as a post-process (assembling process), the wafer is diced to be separated and segmented into individual semiconductor devices. Thereafter, the semiconductor devices are subjected to a packaging process and a final test process and then shipped as products encapsulated or molded in plastic resin or the like.

The semiconductor device is provided with a characteristic checking element for the purpose of evaluating such a number of manufacturing processes. The characteristic checking element is measured or monitored and a result of the measurement is used for review of conditions in each of the manufacturing processes and for analysis of failures or troubles. By checking the characteristic checking element, manufacturing conditions in a semiconductor manufacturer are revealed. This means that the characteristic checking element includes a number of confidential matters of the semiconductor manufacturer. Therefore, the characteristic checking element is generally disposed in a dicing line for separating and segmenting the semiconductor devices on the wafer into individual semiconductor devices. The characteristic checking element disposed in the dicing line is broken during dicing. Therefore, measurement of the characteristic checking element is impossible in a state where the semiconductor device is shipped. Thus, the confidential matters of the semiconductor manufacturer have not been leaked outside.

In recent years, however, in order to further downsize an electronic device, it is often that a customer assembles the semiconductor device into a multi-chip package or the like. In this case, on the side of the customer supplied with the semiconductor device, the semiconductor device is combined with other semiconductor devices and encapsulated or molded in plastic resin to be produced as a commercial product. To such a customer, the semiconductor device in a wafer state is shipped. The characteristic checking element for the semiconductor device shipped in a wafer state is not protected by any means to inhibit easy measurement. Therefore, it is possible to easily measure the characteristic checking element by standing probes onto a measurement pad with their tips in contact therewith.

By analyzing a result of the measurement of the characteristic checking element, it is possible to easily presume or deduce confidential matters regarding semiconductor design and manufacture, such as transistor characteristics and a resistance value of a wiring material. Thus, information regarding the semiconductor design may be leaked to competitors. Thus, a semiconductor manufacturer loses a significant intellectual property in case where characteristics of the semiconductor device manufactured by an advanced process are measured and the information regarding the semiconductor design is leaked outside. The above-mentioned possibility of measurement of the characteristic checking element results in a problem that the semiconductor manufacturer loses its intellectual property and suffers a great loss.

Herein, a wafer provided with the characteristic checking element will be described with reference to FIGS. 1A, 1B, and 1C. FIGS. 1A, 1B, and 1C are a plan view of the wafer, a view showing pad arrangement of the characteristic checking element, and a view showing connection of transistors of the characteristic checking element, respectively. On a wafer 1, dicing lines 3 are arranged in vertical and horizontal directions and a plurality of semiconductor devices 2 are arranged in a matrix fashion. Each of the semiconductor devices 2 has four sides surrounded by the dicing lines 3. At several portions of the dicing lines 3, characteristic checking elements 4, such as transistors or the like, are disposed in order to check characteristics in manufacturing. Each of the characteristic checking elements 4 comprises, for example, three checking transistors 7. The checking transistors 7 have drains (D) connected to individual measurement pads 6, respectively. The checking transistors 7 have gates (G) connected to a common measurement pad 6 and sources (S) connected to another common measurement pad 6.

The semiconductor device 2 has a sub-connection wiring region 11 which is formed at its periphery and provided with a sub-connection wiring 9. Inside the semiconductor device 2, a semiconductor circuit region 10 including a plurality of bonding pads 5 is formed. Each bonding pad 5 serves as a probe pad in a P/W process and also as a connection pad for connection to an external terminal. By standing probes onto the measurement pads 6 for the drains (D), the sources (S), and the gates (G) of the checking transistors 7, characteristics of the checking transistors 7 can be measured. In case where a customer obtains the semiconductor device in such a wafer state, the checking transistors 7 can easily be measured. By analyzing characteristics of the measured transistors, it is possible to easily presume the confidential matters regarding the semiconductor design and manufacture. Thus, there is a problem that information regarding the semiconductor design is leaked to competitors.

As means for inhibiting measurement of the characteristic checking elements of the wafer, there are various methods. For example, it is proposed "to break the elements by laser radiation", "to physically cut or sever wirings connected to the elements", "to stand probes on the elements in dicing lines and break them by applying an electric voltage and an electric current", or the like. However, in each method, the above-mentioned operation must be executed individually for the characteristic checking elements disposed in the wafer. Consequently, a new process is required in order to break the characteristic checking elements. This causes a problem of cost increase.

Characteristic checking elements disposed inside a semiconductor chip and dicing lines are disclosed in the following patent documents. In Japanese Unexamined Patent Application Publication (JP-A) No. 2002-93868, a characteristic checking element is disposed inside a semiconductor chip and a corresponding measurement pad is disposed inside another adjacent semiconductor chip. The characteristic checking element and the measurement pad are connected through a connection wiring across a dicing line. During dicing, the connection wiring between the characteristic checking element and the measurement pad is cut and the characteristic checking element and the measurement pad on the different semiconductor chips are separated to thereby preclude the possibility of subsequent measurement of the characteristic checking element. In Japanese Unexamined Patent Application Publication (JP-A) No. 2005-150514, measurement of a circuit to be inspected is inhibited in response to a signal from a dicing detector. In Japanese Unexamined Patent Application Publication (JP-A) No. 2000-349130, a depletion type transistor is connected between measurement pads of a characteristic checking element. The transistor has a gate connected to a gate potential application pad via a fuse element. By cutting the fuse element, measurement of the characteristic checking element is inhibited.

In Japanese Unexamined Patent Application Publication (JP-A) No. 2006-41236, a measurement pad connected to a bonding pad is disposed in a dicing line. A connection wiring at a boundary between a chip area and the dicing line is arranged as a lower layer so as to prevent the wiring from being peeled off and protruded upward during dicing. In Japanese Unexamined Patent Application Publication (JP-A) No. 2002-217196, interconnections are formed in a dicing line to the vicinity of a distal end of a wafer so as to avoid a characteristic checking element. Thus, a uniform depositing rate of plating is achieved between a center portion and a peripheral portion of the wafer.

In Japanese Unexamined Patent Application Publication (JP-A) No. 2003-332398, a diffusion region of a characteristic checking element in a dicing line is shaded or light-shielded by an aluminum pattern. In Japanese Unexamined Patent Application Publication (JP-A) No. 2005-116606, a measurement pad is formed by a conductive organic film. After inspection, the organic film is removed by using a solvent to thereby inhibit measurement. In Japanese Unexamined Patent Application Publication (JP-A) No. 2004-47535 and Japanese Unexamined Patent Application Publication (JP-A) No. H5-47892, a characteristic checking element is disposed in a dicing line and a measurement pad is disposed inside a chip. However, none of the above-mentioned patent documents describes the problems mentioned above and suggests a solution technology therefor.

SUMMARY OF THE INVENTION

As mentioned above, in case where the semiconductor device is shipped to a customer in a wafer state, it is possible to measure the characteristic checking element. This causes a problem that, by measuring and analyzing the characteristic checking element, confidential matters regarding semiconductor design and manufacture are leaked outside. It is therefore an object of the present invention to prevent, in a semiconductor device shipped in a wafer state, a leak of information regarding semiconductor design and manufacture. For that purpose, the characteristic checking element is broken in an existing process (without requiring an additional process) so that no accurate measurement value is indicated. Thereafter, the semiconductor device is shipped in a wafer state. It is also an object of the present invention to provide a semiconductor device provided with a characteristic checking element, which is capable of preventing a leak of information regarding semiconductor design and manufacture, such as transistor characteristics, by breaking the characteristic checking element.

In order to achieve the above-mentioned objects, the present invention basically adopts techniques which will be described hereinunder. It will readily be understood that the present invention encompasses various modifications and applied technologies without departing from the scope of the present invention.

Semiconductors according to the present invention are as flows:

(1) A semiconductor device having a characteristic checking element disposed in a dicing line and an internal measurement pad disposed in the semiconductor device and connected to the characteristic checking element, wherein:

the internal measurement pad is applied with an electric voltage during a semiconductor device operation test executed in a wafer state so that a function of the characteristic checking element is destroyed.

(2) The semiconductor device as described in the above-mentioned (1), wherein the internal measurement pad and the characteristic checking element are connected by a connection wiring which is disposed across a part of a sub-connection wiring formed at the periphery of the semiconductor device after the part of the sub-connection wiring is cut.

(3) The semiconductor device as described in the above-mentioned (2), wherein a plurality of internal measurement pads are disposed in a wafer in correspondence to a plurality of semiconductor devices formed on the wafer, the internal measurement pads being connected in common in the dicing lines.

(4) The semiconductor device as described in the above-mentioned (1), wherein the characteristic checking element is a checking transistor having a drain and a source connected to corresponding measurement pads, respectively, and a gate connected to a corresponding measurement pad and to the internal measurement pad, the internal measurement pad being applied with an electric voltage during the semiconductor device operation test so that the gate of the checking transistor is broken.

(5) The semiconductor device as described in the above-mentioned (1), wherein the characteristic checking element comprises a plurality of checking transistors having drains connected to individual measurement pads, respectively, sources connected to a common measurement pad, and gates connected to a common measurement pad and to the internal measurement pad, the internal measurement pad being applied with an electric voltage during the semiconductor device operation test so that the gates of the checking transistors are broken.

(6) The semiconductor device as described in the above-mentioned (1), wherein the characteristic checking element is a checking resistance element having measurement pads formed on both ends thereof, the checking resistance element being provided with a transistor having a gate connected to a part of the checking resistance element and to the internal measurement pad and a drain and a source which are connected to a substrate electric potential, the internal measurement pad being applied with an electric voltage during the semiconductor device operation test so that the gate of the transistor is broken.

(7) The semiconductor device as described in the above-mentioned (6), wherein the transistor is disposed in the dicing line, the gate of the transistor and the part of the checking resistance element being connected through a connection wiring which is a conductive wiring layer forming the checking resistance element or a lower conductive wiring layer.

(8) The semiconductor device as described in the above-mentioned (1), wherein the characteristic checking element is a checking resistance element having measurement pads formed on both ends thereof, the checking resistance element being provided with a transistor having a gate connected to the internal measurement pad, one diffusion layer connected to a part of the checking resistance element, and the other diffusion layer connected to a substrate electric potential, the internal measurement pad being applied with an electric voltage during the semiconductor device operation test so that the gate of the transistor is broken.

(9) The semiconductor device as described in the above-mentioned (8), wherein the transistor is disposed in the dicing line, the one diffusion layer of the transistor and the part of the checking resistance element being connected through a connection wiring which is a conductive wiring layer forming the checking resistance element or a lower conductive wiring layer.

The semiconductor device of the present invention has the internal measurement pad additionally disposed inside the semiconductor device. In the process (P/W process) of verifying operations of the semiconductor device in a wafer state, an electric voltage is applied to the internal measurement pad to destroy the function of the characteristic checking element. At the time of shipping, the function of the characteristic checking element is broken. Therefore, the present invention provides an effect that a leak of information regarding semiconductor design and manufacture can be prevented. Further, since the function of the characteristic checking element is destroyed in an existing process, i.e. the process of verifying operations of the semiconductor device, an additional process is not required. Therefore, another effect is obtained that no cost increase of the semiconductor device is caused. According to the present invention, it is possible to provide a semiconductor device capable of destroying a function of a characteristic checking element without requiring a special additional process and preventing a leak of information regarding semiconductor design and manufacture.

DESCRIPTION OF THE EXEMPLARY EMBODIMENTS

Figure 1A:
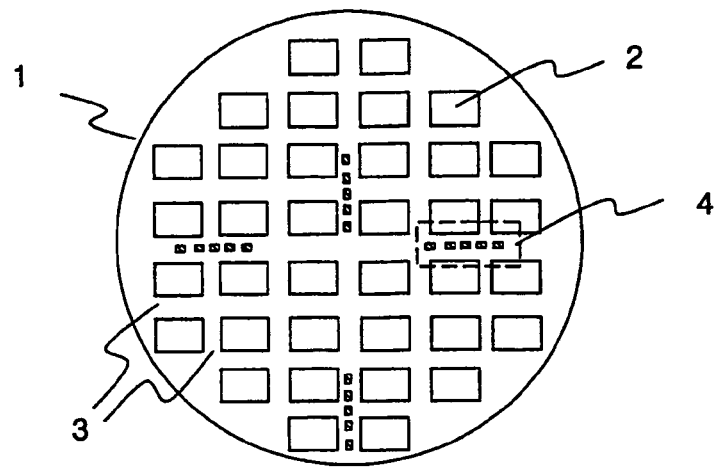
FIG. 1A is a plan view of a related wafer.
Figure 1B:
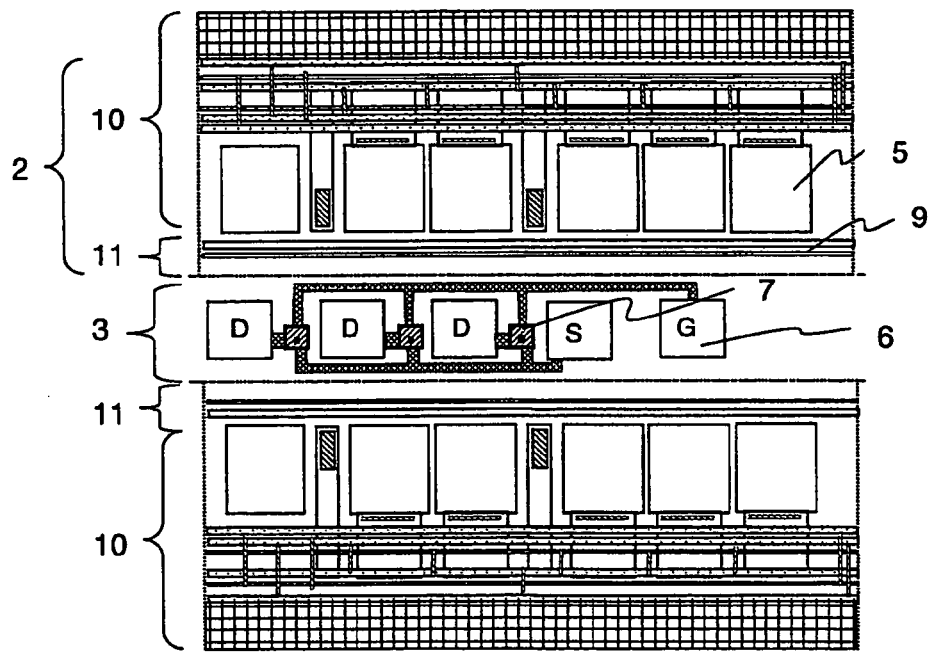
FIG. 1B is a view showing a pad arrangement of checking transistors.
Figure 1C:
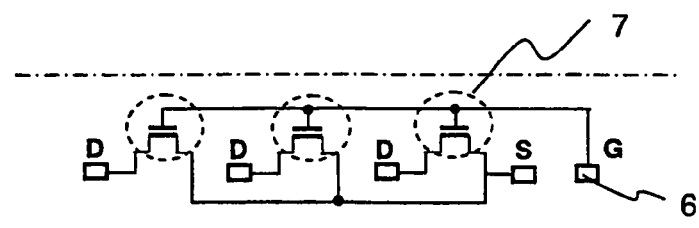
FIG. 1C is a view showing connection of the checking transistors.

Now, several embodiments of the present invention will be described in detail with reference to the drawing.

First Embodiment

Figure 2A:
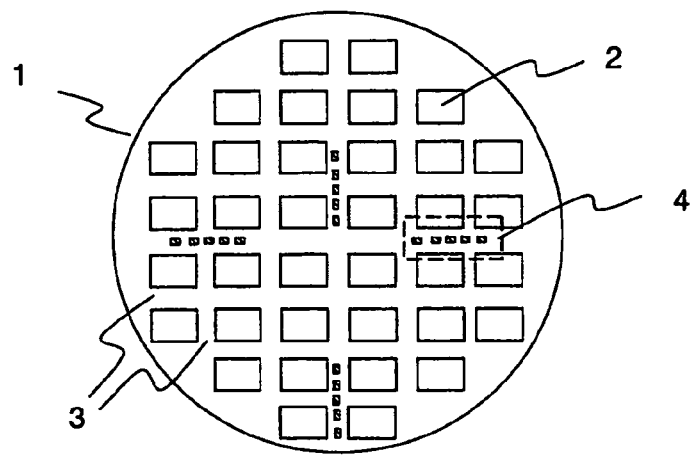
FIG. 2A is a plan view of a wafer according to a first embodiment of the present invention.
Figure 2B:
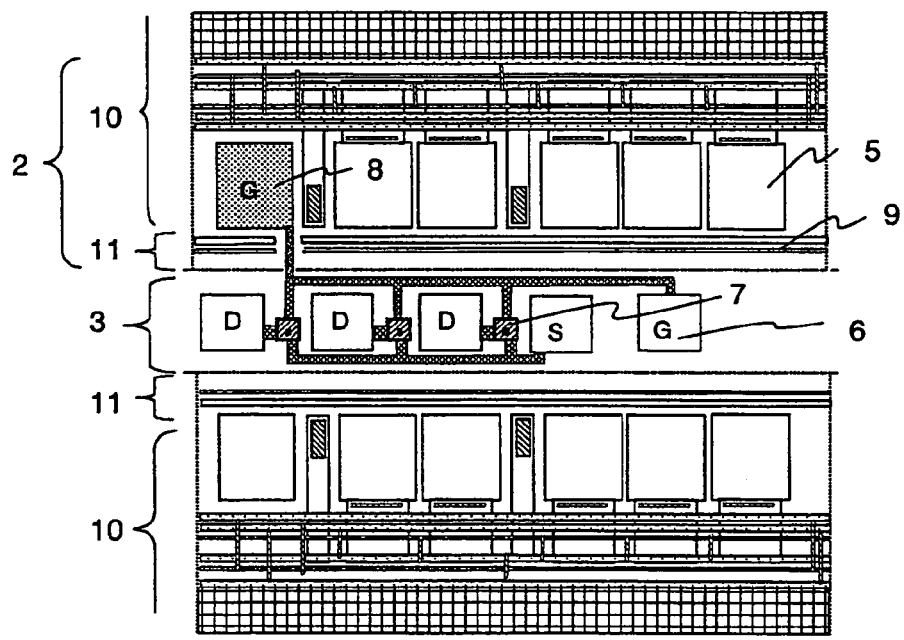
FIG. 2B is a view showing a pad arrangement of checking transistors.
Figure 2C:
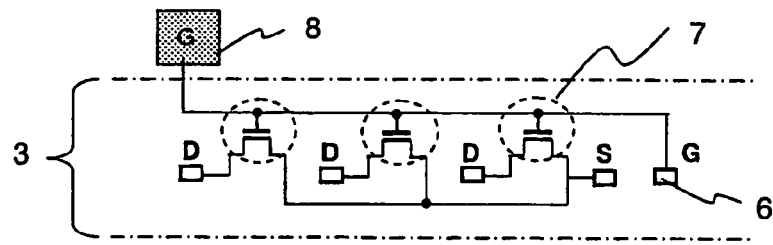
FIG. 2C is a view showing connection of the checking transistors.
Figure 3A:
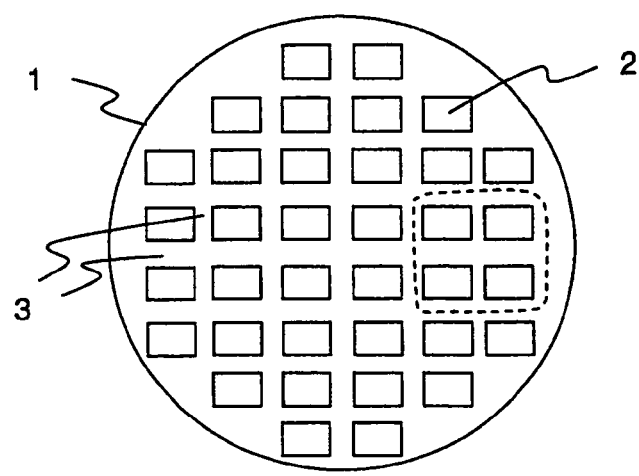
FIG. 3A is a plan view of the wafer for describing a sub-connection wiring.
Figure 3B:
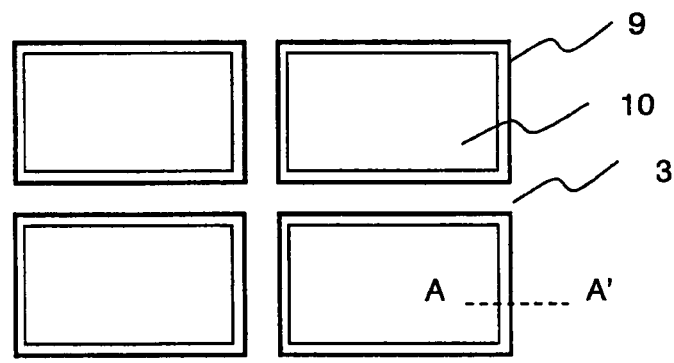
FIG. 3B is an enlarged plan view of a part of the wafer in FIG. 3A.
Figure 3C:
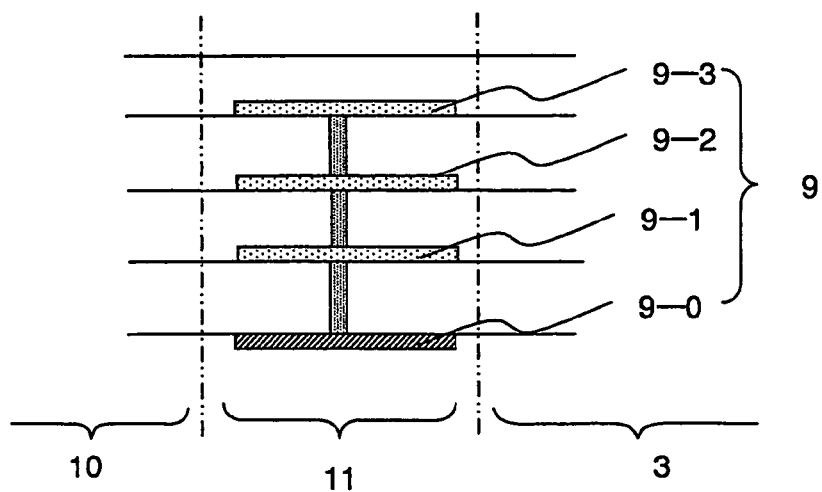
FIG. 3C is a sectional view of the sub-connection wiring.

Referring to FIGS. 2 and 3, a semiconductor device according to a first embodiment of the present invention will be described. As a characteristic checking element of the first embodiment, three checking transistors are shown by way of example. FIGS. 2A, 2B, and 2C show a plan view of a wafer, a view showing a pad arrangement of the characteristic checking element, and a view showing connection of the checking transistors as the characteristic checking element, respectively. FIGS. 3A, 3B, and 3C show a plan view of the wafer, an enlarged plan view of a part of the wafer, and a sectional view of a sub-connection wiring taken along a line A-A' in FIG. 3B, respectively.

On a wafer 1, a plurality of semiconductor devices 2 are arranged in a matrix fashion. Each of the semiconductor devices 2 has four sides surrounded by dicing lines 3. The dicing lines 3 for separating and segmenting the wafer 1 into the individual semiconductor devices 2 are formed in vertical and horizontal directions. At several portions of the dicing lines 3, characteristic checking elements 4, such as transistors or the like, are disposed in order to check characteristics in manufacturing. FIG. 2A shows the characteristic checking elements 4, four in number, two by two in vertical and horizontal directions. Each of the characteristic checking elements 4 comprises three checking transistors 7. The checking transistors 7 have drains (D) connected to individual measurement pads 6, respectively. The checking transistors 7 have gates (G) connected to a common measurement pad 6 and sources (S) connected to another common measurement pad 6. The checking transistors 7 and the measurement pads 6 are all disposed in the dicing lines 3.

The semiconductor device 2 has a sub-connection wiring region 11 which is formed at its periphery and provided with a sub-connection wiring 9. Inside the semiconductor device 2, a semiconductor circuit region 10 including a plurality of bonding pads 5 is formed. One of the bonding pads 5 is used as an internal measurement pad 8 (i.e., a measurement pad 8 disposed inside the semiconductor device 2) and connected to the gates (G) of the three checking transistors 7. The internal measurement pad 8 is disposed inside the semiconductor device 2 in order that a probe card used in a PAN process in a wafer state is implemented without requiring any special structure. The internal measurement pad 8 must have a size sufficient for probing (standing probes) upon executing verification of operations of the semiconductor device 2 in a wafer state. Therefore, the internal measurement pad 8 may be smaller in size than a normal bonding pad 5.

Generally, between the dicing line 3 and the internal measurement pad 8, the sub-connection wiring 9 is arranged for connection to a semiconductor substrate (sub). In case where the characteristic checking element 4 inside the dicing line 3 is connected to the internal measurement pad 8, a part of the sub-connection wiring 9 may be cut to make a connection therebetween, as shown in FIG. 2B. Alternatively, the connection may be made by using a conductive wiring layer which is not used as the sub-connection wiring 9.

The sub-connection wiring 9 serves to define a semiconductor device region and a dicing line region and to supply an electric potential to the semiconductor substrate (sub). FIGS. 3A, 3B, and 3C show a relationship between the sub-connection wiring 9 and the semiconductor device 2 as well as a sectional structure of the sub-connection wiring 9. FIGS. 3A, 3B, and 3C show a plan view of the wafer 1, an enlarged plan view of a part of the wafer 1, and a sectional view of the sub-connection wiring 9 taken along a line A-A' in FIG. 3B, respectively. The sub-connection wiring 9 has a structure surrounding four sides of the semiconductor circuit region 10 and is disposed at the periphery of the semiconductor device 2. In the sectional structure of the sub-connection wiring 9, a plurality of wiring layers are formed in a plurality of insulating films, respectively.

In FIG. 3C, the sub-connection wiring 9 includes sub-connection wiring members 9-0, 9-1, 9-2, and 9-3. The sub-connection wiring member 9-0 comprises a diffusion wiring layer formed in the semiconductor substrate (sub). The sub-connection wiring member 9-1 comprises a first conductive wiring layer. The sub-connection wiring member 9-2 comprises a second conductive wiring layer. The sub-connection wiring member 9-3 comprises a third conductive wiring layer. These sub-connection wiring members are connected to one another through a contact plug. Therefore, even in case where a part of the sub-connection wiring 9 is cut, the semiconductor device 2 is prevented from decline in function. In case of FIG. 2B, it is assumed that, for example, a part of the sub-connection wiring member 9-3 as an upper wiring layer constructing the sub-connection wiring 9 is cut. Even in this case, connection is maintained by the sub-connection wiring members 9-0, 9-1, and 9-2 as lower layers. Thus, there is no problem even if a part of one of the conductive wiring layers constructing the sub-connection wiring 9 is cut or is not used.

Next, an operation of the first embodiment shown in FIGS. 2A to 2C will be described. In case where characteristics of the checking transistor 7 is measured, the gate (G) measurement pad 6, the source (S) measurement pad 6, and the drain (D) measurement pads 6 of the transistor are supplied with a gate voltage, a source voltage, and a drain voltage, respectively. Then, values of the drain voltage and a drain current are monitored to measure the transistor characteristics. In the semiconductor device 2, after a diffusion process is completed, characteristics of the characteristic checking element are checked. Thereafter, the process (P/W process) of verifying electrical operations is executed in a wafer state. Thus, a good product and a defective product are judged and classified.

In the P/W process, an electric voltage is applied to the internal measurement pad 8. By applying the electric voltage, gate insulating films of the checking transistors 7 connected to the internal measurement pad 8 are broken. In general, once a gate insulating film of a transistor is broken, a new current path is formed between a gate terminal and each of a source terminal and a drain terminal so that no accurate characteristics are exhibited any longer. Therefore, after the electric voltage is applied to the internal measurement pad 8, it is impossible to measure accurate characteristics of the checking transistors 7.

In this embodiment, gate electrodes of the checking transistors 7 of the characteristic checking element 4 are connected to, in addition to the measurement pad 6 in the dicing line 3, the internal measurement pad 8. After the characteristic checking element 4 is measured, an electric voltage is supplied from the internal measurement pad 8 in the P/W process, so that the gate insulating films of the checking transistors 7 are broken. Since the gate insulating film of each of the checking transistors 7 is broken, a new current path is formed between the gate terminal and each of the source terminal and the drain terminal. Consequently, measurement of the accurate transistor characteristics is inhibited. According to this embodiment, it is possible to obtain a semiconductor device capable of destroying a function of a characteristic checking element in an existing process, i.e. the P/W process to thereby prevent a leak of information regarding semiconductor design and manufacture.

Second Embodiment

Figure 7:
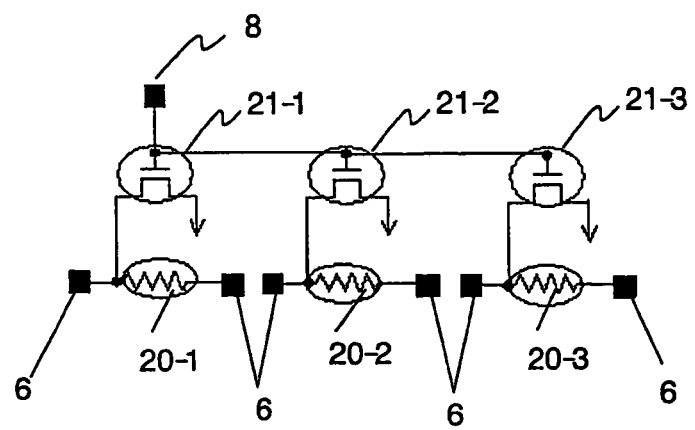
FIG. 7 is a view showing a fourth example of circuit connection of the checking resistance elements according to the second embodiment.
Figure 8:
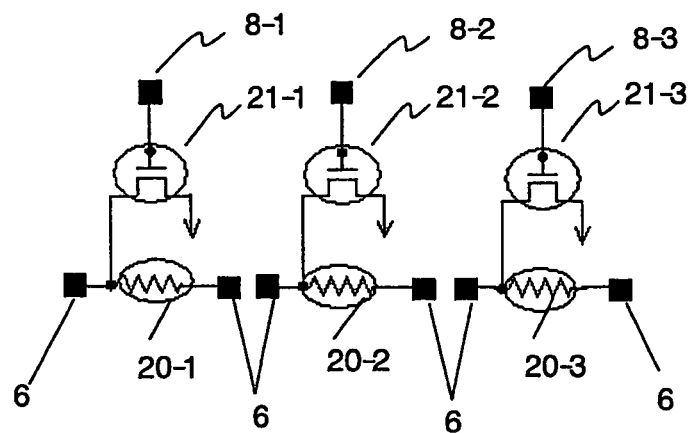
FIG. 8 is a view showing a fifth example of circuit connection of the checking resistance elements according to the second embodiment.
Figure 9A:
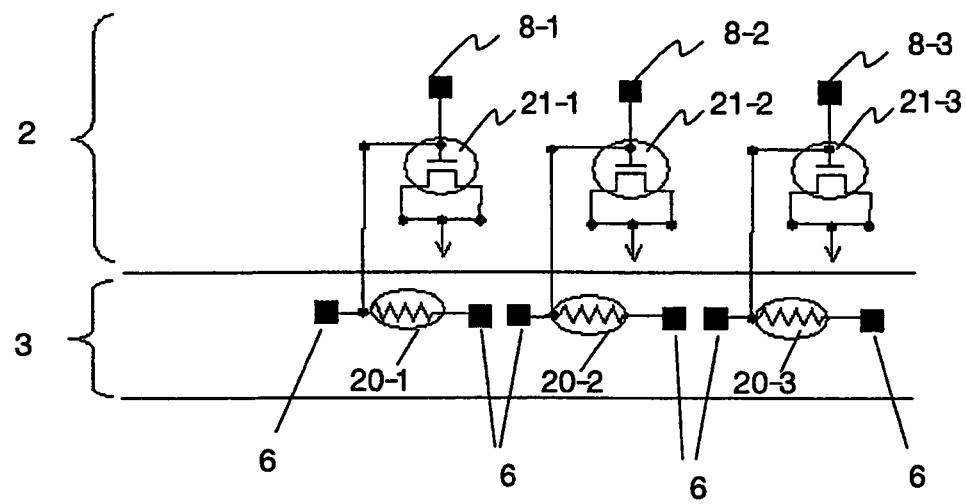
FIG. 9A is a view showing a first arrangement of the checking resistance elements according to the second embodiment.
Figure 9B:
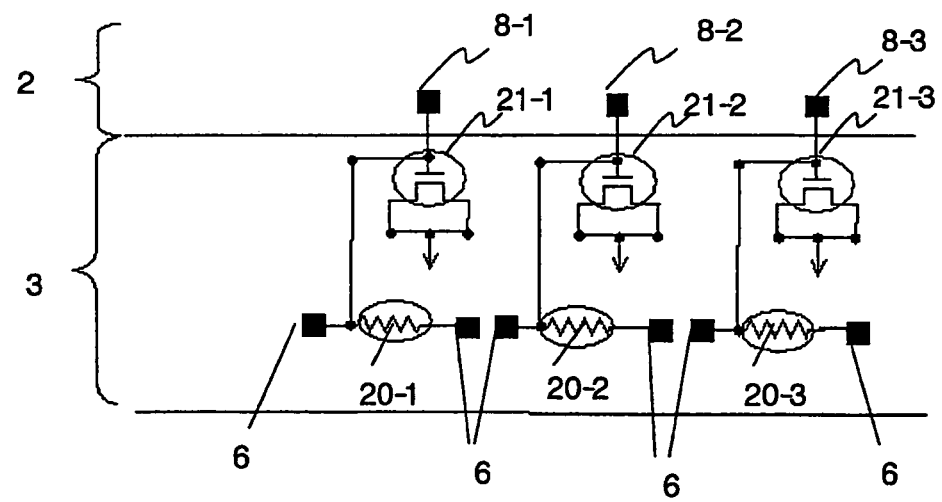
FIG. 9B is a view showing a second arrangement of the checking resistance elements according to the second embodiment.

Referring to FIGS. 4 through 9B, a semiconductor device according to a second embodiment of the present invention will be described. As a characteristic checking element of the second embodiment, checking resistance elements are shown by way of example. It is difficult to break the checking resistance elements merely by applying an electric voltage. Therefore, in this embodiment, the checking resistance elements constituting the characteristic checking element are connected to an easily breakable transistor. FIGS. 4 through 8 are views showing first through fifth examples of circuit connections of the checking resistance elements, respectively. FIGS. 9A and 9B show arrangements of the checking resistance elements.

Figure 4:
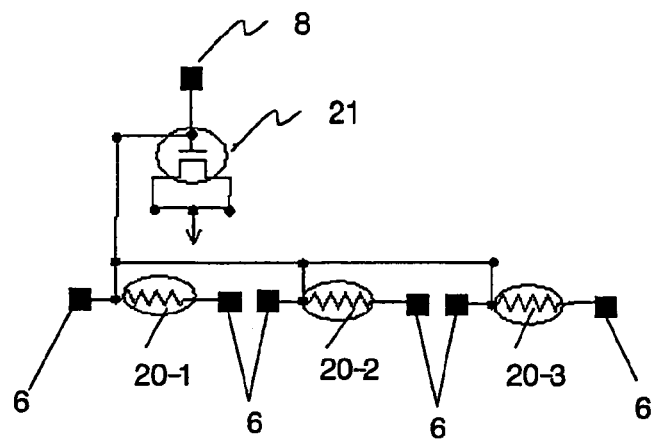
FIG. 4 is a view showing a first example of circuit connection of checking resistance elements according to a second embodiment.
Figure 5:
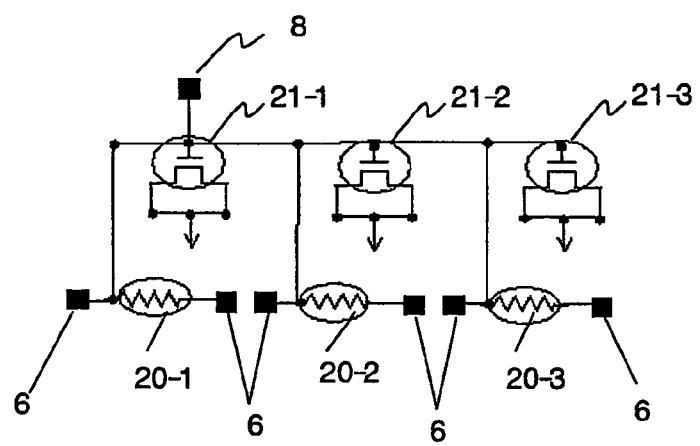
FIG. 5 is a view showing a second example of circuit connection of the checking resistance elements according to the second embodiment.

FIG. 4 is a view showing the first example of circuit connection in case where the characteristic checking element comprises the checking resistance elements. It is difficult to break the checking resistance elements merely by applying an electric voltage. Therefore, each of checking resistance elements 20-1, 20-2, and 20-3 constituting a characteristic checking element has one end connected to a gate of an easily breakable transistor 21. At both ends of each of the checking resistance elements 20-1, 20-2, and 20-3, respective measurement pads 6 are disposed and connected thereto. Further, the one ends of the checking resistance elements 20-1, 20-2, and 20-3 are connected in common to an internal measurement pad 8. The gate of the transistor 21 is connected to the internal measurement pad 8. A drain and a source of the transistor 21 are connected in common to a semiconductor substrate (sub).

The checking resistance elements 20-1, 20-2, and 20-3 can be measured by the respective measurement pads 6. In a subsequent P/W process, an electric voltage is applied to the internal measurement pad 8 to break a gate insulating film of the transistor 21. After the gate insulating film is broken, a new current path leading to the semiconductor substrate (sub) is formed in the transistor 21. Therefore, when an electric potential is supplied to the measurement pad 6 and a resistance value is measured, no accurate measurement value is indicated. After the electric voltage is applied to the internal measurement pad 8, the transistor 21 is broken. Hence, accurate characteristics of the characteristic checking element (checking resistance elements 20) can not be measured. Thus, after shipment, no accurate characteristics of the characteristic checking element can be measured. It is therefore possible to prevent a leak of information regarding semiconductor design and manufacture.

Likewise, FIGS. 5 through 8 show the second through the fifth examples of circuit connection of the characteristic checking element, respectively. In the second example of circuit connection shown in FIG. 5, the checking resistance elements 20-1, 20-2, and 20-3 are connected to transistors 21-1, 21-2, and 21-3, respectively. At both ends of each of the checking resistance elements 20-1, 20-2, and 20-3, respective measurement pads 6 are disposed and connected thereto. Gates of the transistors 21-1, 21-2, and 21-3 and one ends of the checking resistance elements 20-1, 20-2, and 20-3 are connected in common to the internal measurement pad 8. Drains and sources of the transistors 21-1, 21-2, and 21-3 are connected in common to the semiconductor substrate (sub).

Figure 6:
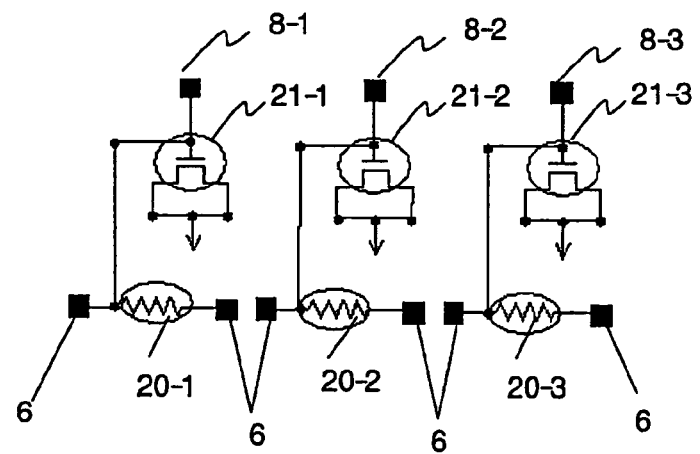
FIG. 6 is a view showing a third example of circuit connection of the checking resistance elements according to the second embodiment.

In the third example of circuit connection shown in FIG. 6, the checking resistance elements 20-1, 20-2, and 20-3 are connected to the transistors 21-1, 21-2, and 21-3 and internal measurement pads 8-1, 8-2, and 8-3, respectively. At both ends of each of the checking resistance elements 20-1, 20-2, and 20-3, respective measurement pads 6 are disposed and connected thereto. Gates of the transistors 21-1, 21-2, and 21-3 are connected to the internal measurement pads 8-1, 8-2, and 8-3 and one ends of the checking resistance elements 20-1, 20-2, and 20-3, respectively. Drains and sources of the transistors 21-1, 21-2, and 21-3 are connected in common to the semiconductor substrate (sub).

In the fourth example of circuit connection shown in FIG. 7, the checking resistance elements 20-1, 20-2, and 20-3 are connected to the transistors 21-1, 21-2, and 21-3, respectively. At both ends of each of the checking resistance elements 20-1, 20-2, and 20-3, respective measurement pads 6 are disposed and connected thereto. Gates of the transistors 21-1, 21-2, and 21-3 are connected in common to the internal measurement pad 8. One of diffusion layers of each of the transistors 21-1, 21-2, and 21-3 is connected to the semiconductor substrate (sub). The other diffusion layers of the transistors 21-1, 21-2, and 21-3 are connected to one ends of the checking resistance elements 20-1, 20-2, and 20-3, respectively.

In the fifth example of circuit connection shown in FIG. 8, the checking resistance elements 20-1, 20-2, and 20-3 are connected to the transistors 21-1, 21-2, and 21-3 and the internal measurement pads 8-1, 8-2, and 8-3, respectively. At both ends of each of the checking resistance elements 20-1, 20-2, and 20-3, respective measurement pads 6 are disposed and connected thereto. Gates of the transistors 21-1, 21-2, and 21-3 are connected to the internal measurement pads 8-1, 8-2, and 8-3, respectively. One of the diffusion layers of each of the transistors 21-1, 21-2, and 21-3 is connected to the semiconductor substrate (sub). The other diffusion layers of the transistors 21-1, 21-2, and 21-3 are connected to one ends of the checking resistance elements 20-1, 20-2, and 20-3, respectively.

FIGS. 9A and 9B show arrangements of the above-mentioned checking resistance elements. In FIG. 9A, the transistors 21-1, 21-2, and 21-3 are disposed inside the semiconductor device 2. On the other hand, in FIG. 9B, the transistors 21-1, 21-2, and 21-3 are disposed inside the dicing line 3. Thus, the transistors 21-1, 21-2, and 21-3 whose gates are to be broken for the purpose of forming a new current path can be disposed inside the semiconductor device 2 or in the dicing line 3. The internal measurement pads 8-1, 8-2, and 8-3 are disposed inside the semiconductor device 2. The checking resistance elements 20-1, 20-2, and 20-3 and the measurement pads 6 are disposed in the dicing line 3.

As mentioned above, for the checking resistance element hardly broken merely by applying an electric voltage, the transistor whose gate is easily broken is added. The gate of the added transistor is broken to thereby form a new current path. The new current path makes it difficult to measure the checking resistance element. For the purpose of forming a new current path, use may be made of any structure capable of breaking the gate of the transistor and forming a new current path without limitation to the above-mentioned examples of connection. Therefore, the number of pads to be disposed in a chip and the number of transistors to be broken may be any appropriate numbers other than those illustrated in the figures and connection may be made in any appropriate manner other than those illustrated in the figures.

The checking resistance element of the present embodiment is connected to the transistor added thereto and the gate of the transistor is broken to form a new current path. By forming the new current path, measurement of accurate characteristics of the checking resistance element is inhibited. According to the present embodiment, a function of the characteristic checking element can be destroyed in an existing process, i.e. the P/W process. Since the function of the characteristic checking element can be destroyed, it is possible to obtain a semiconductor device capable of preventing a leak of information regarding semiconductor design and manufacture.

Third Embodiment

Figure 10A:
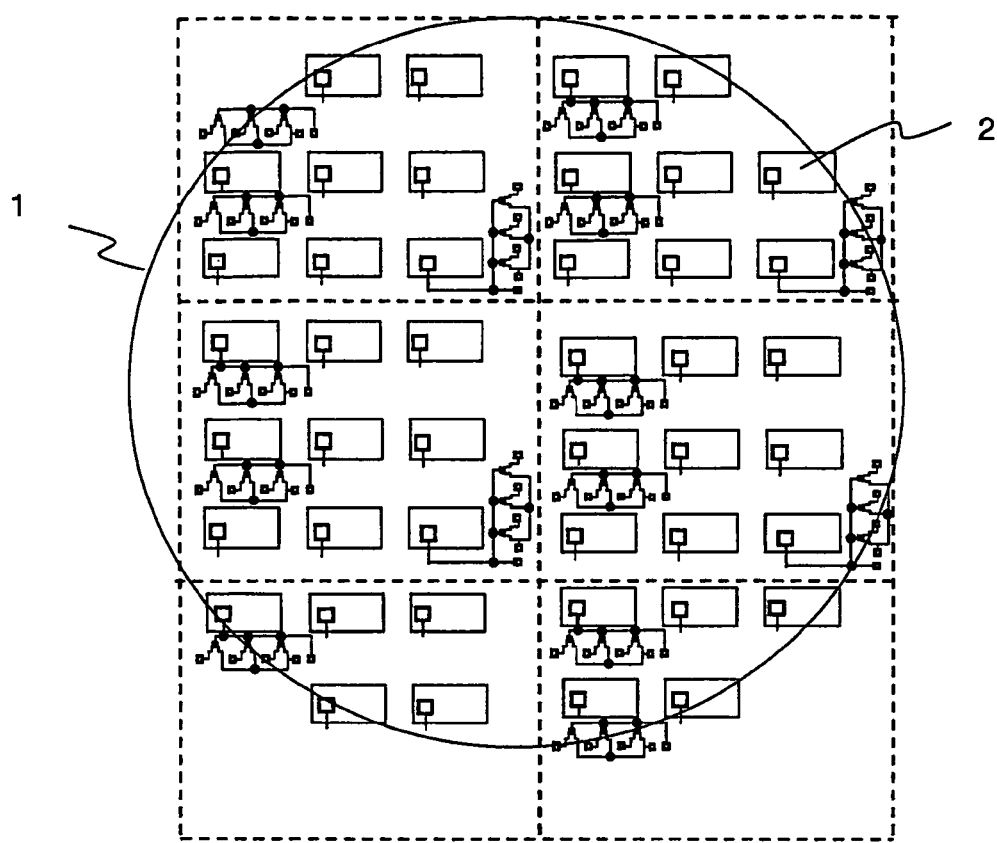
FIG. 10A is a plan view of a wafer according to a third embodiment.
Figure 10B:
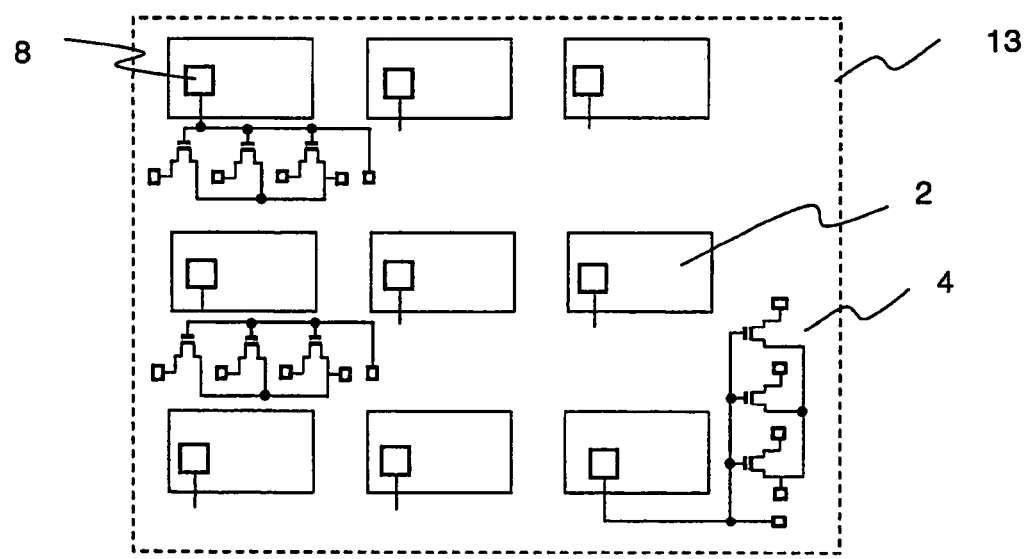
FIG. 10B is a connection diagram of a reticle.
Figure 11A:
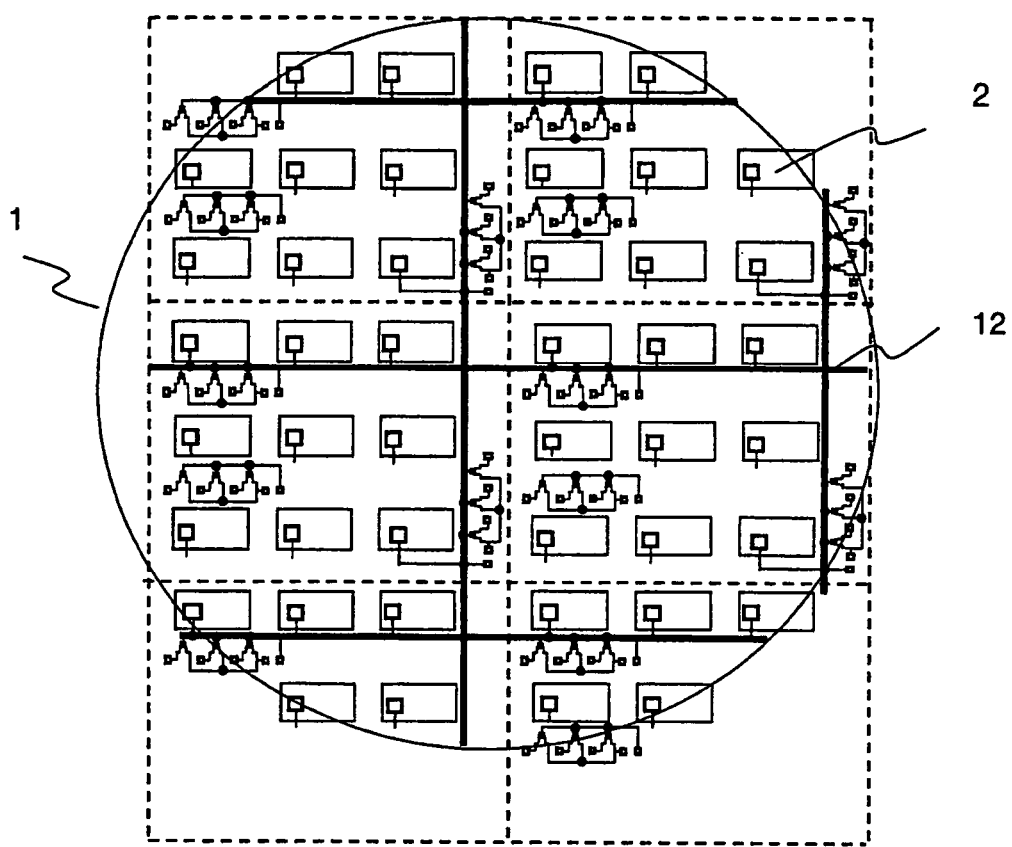
FIG. 11A is a plan view of another wafer according to the third embodiment.
Figure 11B:
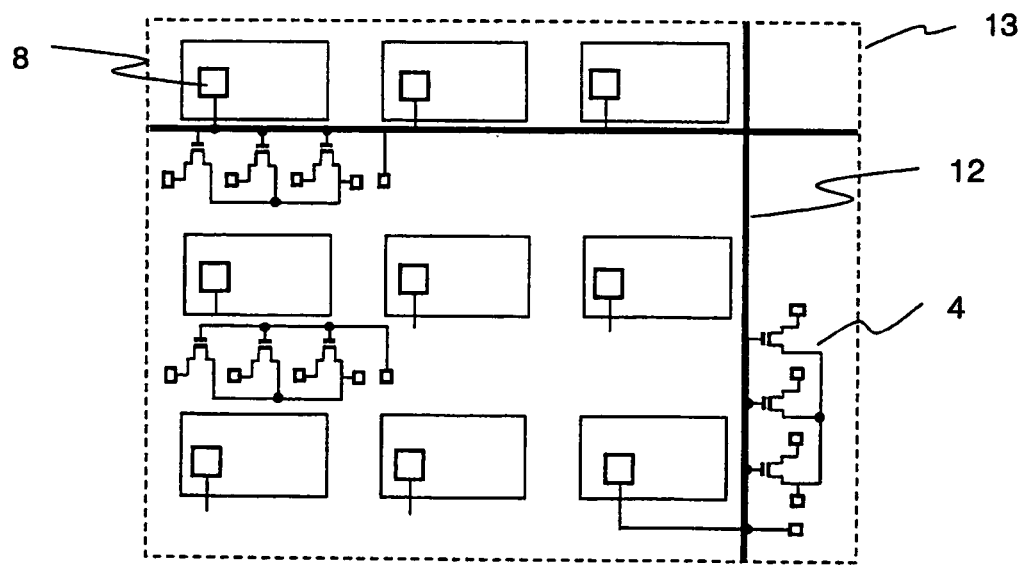
FIG. 11B is a connection diagram of another reticle.

Referring to FIGS. 10A, 10B, 11A, and 11B, a semiconductor device according to a third embodiment of the present invention will be described. This embodiment shows connection between an internal measurement pad and a characteristic checking element in a wafer state. As the characteristic checking element, three checking transistors are shown by way of example. FIG. 10A is a plan view of a wafer and FIG. 10B is a connection diagram of a reticle for use in a photolithography process. FIGS. 11A and 11B show an embodiment in which the characteristic checking elements are connected to one another by the dicing line. FIG. 11A is a plan view of a wafer and FIG. 11B is a connection diagram of a reticle for use in the photolithography process.

Description will be made about connection of the characteristic checking elements 4 on the reticle 13 in FIG. 10B. On the reticle 13, the semiconductor devices 2 are disposed, nine in total, in three (top, middle, and bottom) horizontal rows and in three (left, center, and right) vertical rows. Three characteristic checking elements 4 are disposed in correspondence to the three semiconductor devices 2 (top-left, middle-left, and bottom-right), respectively. Each of the top-left and the middle-left characteristic checking elements 4 is provided with and connected to three transistors arranged in a horizontal direction in the figure. The bottom-right characteristic checking element 4 is provided with three transistors arranged in a vertical direction in the figure. The three transistors of each of the characteristic checking elements 4 have gates connected together in common. The top-left and the bottom-right characteristic checking elements 4 desired to be broken are connected to the internal measurement pads 8, respectively. The middle-left characteristic checking element 4 which need not be broken is not connected to the internal measurement pad 8.

Thus, the characteristic checking element 4 and the internal measurement pad 8 are connected or not connected to each other. Specifically, each of the top-left and the bottom-right characteristic checking elements 4 connected to the internal measurement pad 8 can be broken. On the other hand, the middle-left characteristic checking element 4 is not connected to the internal measurement pad 8 and is not broken. Therefore, the middle-left characteristic checking element 4 is maintained in a measurable state. FIG. 10A shows a wafer manufactured by using the reticle 13. The wafer 1 is subjected to a step-and-repeat process in which the reticle 13 is placed at each of six sections indicated by broken lines for exposure. In this case, the number of characteristic checking elements which are not broken but are kept measurable is reduced. Since the number of measurable characteristic checking elements is reduced, no accurate information can be obtained. Consequently, it is possible to prevent a leak of information regarding semiconductor design and manufacture.

In FIGS. 11A and 11B, the characteristic checking elements 4 in the wafer, which are desired to be broken, are connected to the internal measurement pads 8 through common wirings 12 in the dicing line, respectively. On the other hand, the characteristic checking elements 4 which are not desired to be broken are not connected to the internal measurement pad 8 to which an electric voltage is to be applied. In this case, by applying an electric voltage only once to any one of the internal measurement pads 8, all of the characteristic checking elements 4 connected to the internal measurement pads 8 can be broken. In this case also, some of the characteristic checking elements 4 can be kept in a measurable state without being broken, since they are not connected to the internal measurement pad 8 to which an electric voltage is to be applied.

Connection of the characteristic checking elements and the internal measurement pads is not limited to the foregoing connection methods described in connection with the above embodiment but may be made in any appropriate manner as far as a gate of a transistor is broken to form a new current path. By forming a new current path, accurate characteristics of the checking resistance element can not be measured. As shown in FIGS. 10B and 11B, the semiconductor devices in the reticle use common data. It is possible to arbitrarily construct connection data of the characteristic checking elements and wirings in the dicing lines. Therefore, the above-mentioned connection methods can easily be realized.

In the present embodiment, some of the characteristic checking elements are broken so that the measurement thereof is difficult. By reducing the number of measurable characteristic checking elements, accurate information can not be obtained. Further, the internal measurement pads are connected to one another by the common wirings formed in the dicing lines, so that the characteristic checking elements connected in common can be broken by applying an electric voltage only once. By reducing the number of measurable characteristic checking elements, it is possible to prevent a leak of information regarding semiconductor design and manufacture.

Fourth Embodiment

Figure 12A:
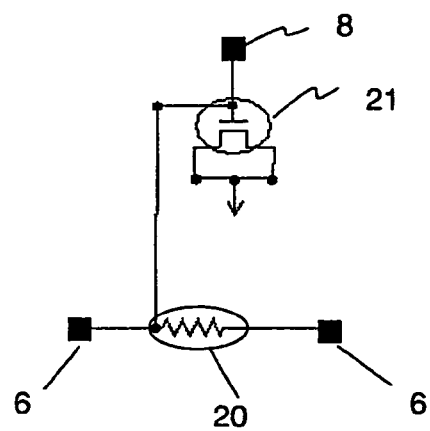
FIG. 12A is a view showing circuit connection of a checking resistance element according to a fourth embodiment.
Figure 12B:
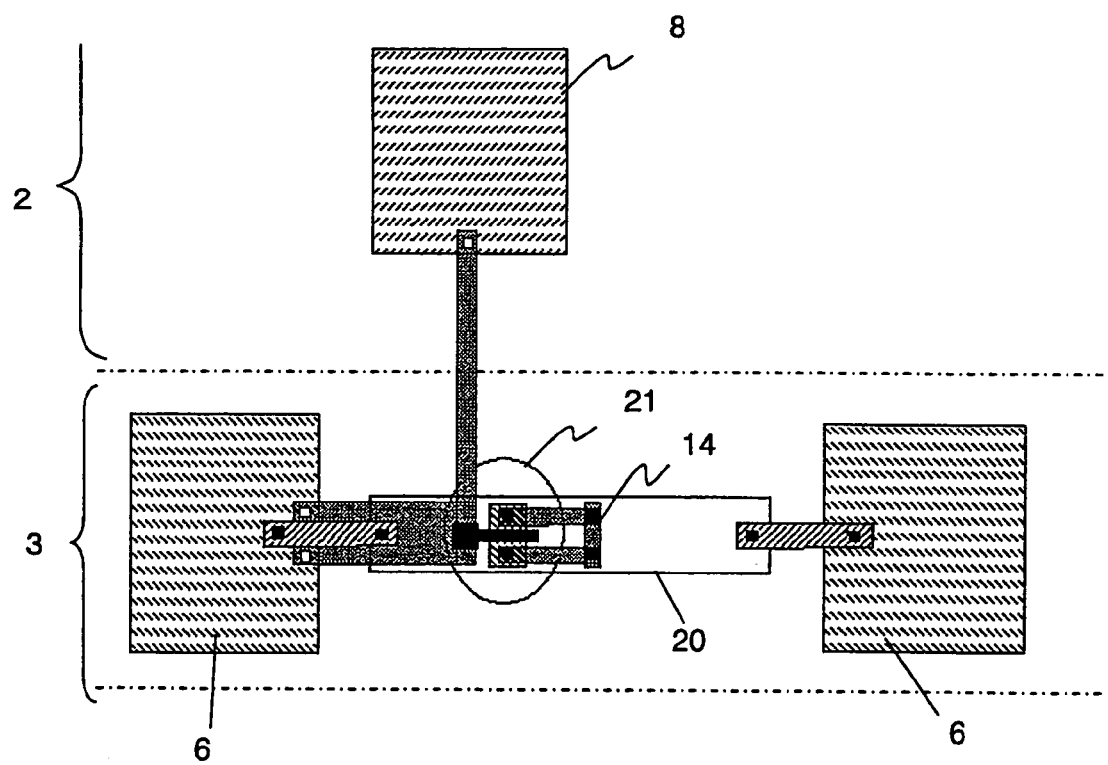
FIG. 12B is a view showing a pattern layout.

Referring to FIGS. 12A and 12B, a semiconductor device according to a fourth embodiment of the present invention will be described. As a characteristic checking element of the fourth embodiment, a checking resistance element is shown by way of example. FIG. 12A is a view showing circuit connection of the checking resistance element and FIG. 12B is a view showing a pattern layout thereof. As described in the foregoing embodiments, a position of the transistor is not especially limited for the purpose of realizing the function of the present invention. However, depending on a connection method with the characteristic checking element which is not desired to be measured, a new current path formed during the P/W process can be blocked by cutting a connection wiring. Thus, there is a disadvantage that the measurement of the characteristic checking element can be carried out again by cutting the connection wiring. In the present embodiment, for the purpose of overcoming the disadvantage mentioned above, the connection wiring between the transistor and the characteristic checking element is hardly cut off.

A checking resistance element 20 serves to check a wiring resistance of a conductive wiring layer. The checking resistance element 20 is provided with measurement pads 6 formed on both ends thereof. One end of the checking resistance element 20 is connected to an internal measurement pad 8 and a gate of a transistor 21. The gate of the transistor 21 is connected to the internal measurement pad 8 and a drain and a source thereof are connected to a sub-potential wiring 14. The checking resistance element 20, the measurement pads 6, and the transistor 21 are disposed in a dicing line 3 while the internal measurement pad 8 is disposed in a semiconductor device 2. An electric voltage is applied to the internal measurement pad 8 to break the gate of the transistor 21, so that a short circuit is formed between the internal measurement pad 8 and a semiconductor substrate (sub). Since the short circuit between the internal measurement pad 8 and the semiconductor substrate (sub) is formed as a new current path, accurate measurement of the checking resistance element 20 is made difficult.

In the pattern layout of FIG. 12B, the transistor 21 is formed on the semiconductor substrate (sub) directly under the checking resistance element 20. A connection wiring from the gate of the transistor 21 is formed by using a conductive wiring layer lower than that used by the checking resistance element 20. In case where the connection wiring between the gate of the transistor 21 and the checking resistance element 20 is physically cut, the checking resistance element 20 itself is cut and broken. Alternatively, a connection wiring between the measurement pad 6 and the checking resistance element 20 is cut. Consequently, measurement of the checking resistance element 20 is made difficult.

In the present embodiment, the transistor 21 is formed on the semiconductor substrate (sub) directly under the checking resistance element 20. However, without limitation to the position directly under the checking resistance element 20, the transistor 21 may be disposed in the vicinity of the checking resistance element 20 and formed by a conductive wiring of the conductive wiring layer used by the checking resistance element 20. Any appropriate structure may be adopted provided that the connection wiring between the gate of the transistor 21 and the checking resistance element 20 can not be cut independently. In other words, in case where the connection wiring between the gate of the transistor 21 and the checking resistance element 20 is cut, the connection wiring between the checking resistance element 20 and the measurement pad 6 must simultaneously be cut. Since the connection wiring between the checking resistance element 20 and the measurement pad 6 is cut, measurement of the checking resistance element 20 is made difficult. According to the present embodiment, measurement of the characteristic checking element is made difficult, so that it is possible to obtain a semiconductor device capable of preventing a leak of information regarding semiconductor design and manufacture.

In the present invention, the gate electrode of the transistor of the characteristic checking element is connected not only to the measurement pad in the dicing line but also to the internal measurement pad additionally provided. After the characteristic checking element is measured, an electric voltage is applied via the internal measurement pad in the P/W process to thereby break the gate insulating film of the transistor. Since the gate insulating film of the transistor is broken, a new current path is formed. Therefore, measurement of accurate characteristics of the characteristic checking element is inhibited. According to the present embodiment, the function of the characteristic checking element is destroyed in an existing process, i.e. the P/W process, so that it is possible to obtain a semiconductor device capable of preventing a leak of information regarding semiconductor design and manufacture.

Although the present invention has thus far been described in detail in connection with the embodiments, the present invention is not limited to the above-mentioned embodiments but may be modified in various manners without departing from the scope of the present invention. It will readily be understood that the present invention encompasses such modifications. In the present invention, the transistor is used as an element for forming a new current path. However, without limitation to the transistor, use may be made of any appropriate element as far as it is broken by applying an electric voltage to form a new current path.

What is claimed is:

1. A semiconductor device comprising:
   a semiconductor circuit region;
   a dicing line area formed along said semiconductor circuit region to define the semiconductor circuit region;
   at least one characteristic checking element formed in said dicing line area;
   a plurality of first pads formed in said dicing line area and electrically connected to said characteristic checking element; and
   at least one second pad formed in said semiconductor circuit region apart from said dicing line area and electrically connected to the characteristic checking element, wherein said at least one characteristic checking element is configured to be rendered inoperative by application of a sufficient electric voltage to said second pad during a semiconductor device test operation.

2. The semiconductor device as claimed in claim 1, wherein the semiconductor circuit region includes a sub-connection wiring area formed along a periphery of the semiconductor circuit region and said second pad is connected to said characteristic checking element through a wiring crossing the sub-connection wiring area.

3. The semiconductor device as claimed in claim 1, wherein said characteristic checking element comprises a checking transistor having a drain, a source and a gate each connected to corresponding one of said first pads, the gate being further connected to said second pad.

4. The semiconductor device as claimed in claim 1, wherein said characteristic checking element comprises a plurality of checking transistors each having a drain, a source and a gate, the drains of the checking transistors being connected respectively to different first ones of the first pads, the source of the checking transistors being connected in common to a second one of the first pads, the gates of the checking transistors being connected respectively to third pad of the first pads and further to the second pad.

5. The semiconductor device as claimed in claim 1, wherein said characteristic checking element comprises a checking resistance element and a transistor, the checking resistance element having first and second ends connected respectively to two of the first pads, the transistor having one of drain and source connected to the checking resistance element and a gate connected to the second pad.

6. The semiconductor device as claimed in claim 5, wherein said transistor has the other of the drain and source connected to a substrate of the semiconductor device.

7. The semiconductor device as claimed in claim 1, wherein said characteristic checking element comprising a checking resistance element having first and second ends and a transistor having a gate and first and second diffusion layers, the first and second ends of the checking resistance element being connected respectively to two of said first pads, the gate of the transistor being connected to said second pad, and the first diffusion layer of the transistor being connected to said checking resistance element.

8. The semiconductor device as claimed in claim 7, wherein the second diffusion layer of said transistor being supplied with a substrate potential that is used for the semiconductor circuit region.

9. The device as claimed in claim 1, further comprising a plurality of third pads formed in the semiconductor circuit region along the dicing line area and a plurality of interconnection lines each formed in the semiconductor circuit region and elongated from an associated one of the third pads to the semiconductor circuit region distantly from the dicing line area.

10. A semiconductor device comprising:
    a semiconductor circuit region;
    a dicing line area formed around the entire periphery of said semiconductor circuit region;
    a characteristic checking element formed in said dicing line area;
    a measurement pad formed in said dicing line area, said measurement pad being electrically connected to said characteristic checking element; and
    an internal measurement pad formed in the semiconductor circuit region, said internal measurement pad being electrically connected to said characteristic checking element;
    wherein said characteristic checking element is configured to be rendered inoperative upon application of a sufficient electric voltage to said internal measurement pad during a semiconductor device test operation.

11. The semiconductor device as claimed in claim 10, wherein said characteristic checking element comprises a checking transistor having a drain, a source and a gate each connected to corresponding one of said measurement pads, the gate being further connected to said internal measurement pad, wherein the gate of said checking transistor is configured to break upon application of said electric voltage.

12. The semiconductor device as claimed in claim 10, wherein said characteristic checking element comprises a plurality of checking transistors each having a drain, a source and a gate, the drains of the checking transistors being connected respectively to different first ones of first pads, said first pads including said measurement pad, the source of the checking transistors being connected in common to a second one of the first pads, the gates of the checking transistors being connected respectively to third pad of the first pads and further to the internal measurement pad, wherein the gate of said checking transistor is configured to break upon application of said electric voltage.

13. The semiconductor device as claimed in claim 10, wherein said characteristic checking element comprises a checking resistance element and a transistor, the checking resistance element having first and second ends connected respectively to two of a plurality of first pads, said first pads including said measurement pad, the transistor having one of drain and source connected to the checking resistance element and a gate connected to the internal measurement pad, wherein the gate of the transistor is configured to break upon application of said electric voltage.

14. The semiconductor device as claimed in claim 10, wherein said characteristic checking element comprising a checking resistance element having first and second ends and a transistor having a gate and first and second diffusion layers, the first and second ends of the checking resistance element being connected respectively to two measurement pads, said two measurement pads including said measurement pad, the gate of the transistor being connected to said internal measurement pad, and the first diffusion layer of the transistor being connected to said checking resistance element, wherein the gate of the transistor is configured to break upon application of said electric voltage.

* * * * *